(12) United States Patent
Chiu et al.

(10) Patent No.: US 12,148,796 B2
(45) Date of Patent: Nov. 19, 2024

(54) SEMICONDUCTOR DEVICE (71) Applicant: UNITED MICROELECTRONICS CORP., Hsin-Chu (TW)

(72) Inventors: Cheng-Pu Chiu, New Taipei (TW); Tzung-Ying Lee, Ping-Tung County (TW); Dien-Yang Lu, Kaohsiung (TW); Chun-Kai Chao, Kaohsiung (TW); Chun-Mao Chiou, Chiayi County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/235,358

(22) Filed: Aug. 18, 2023

(65) Prior Publication Data

US 2023/0395657 A1 Dec. 7, 2023

Related U.S. Application Data (63) Continuation of application No. 17/670,528, filed on Feb. 14, 2022, now Pat. No. 11,764,261, which is a
(Continued)

(30) Foreign Application Priority Data

Oct. 26, 2020 (CN) .......................... 202011153977.9

(51) Int. Cl.
*H01L 29/06* (2006.01)
*H01L 29/78* (2006.01)

(52) U.S. Cl.
CPC ...... *H01L 29/0649* (2013.01); *H01L 29/7851* (2013.01)

(58) Field of Classification Search
CPC ..... H01L 21/823418; H01L 21/823431; H01L 21/823814; H01L 21/823821; H01L 21/845; H01L 27/0886; H01L 27/0924; H01L 27/1211; H01L 29/0649; H01L 29/0653; H01L 29/0843; H01L 29/0847; H01L 29/41725; H01L 29/41758; H01L 29/41775; H01L 29/41783; H01L 29/41791; H01L 29/66636; H01L 29/66795; H01L 29/7848; H01L 29/785;
(Continued)

(56) References Cited

U.S. PATENT DOCUMENTS

10,312,367 B2 6/2019 Phoa et al.
2006/0202266 A1* 9/2006 Radosavljevic .... H01L 29/7843
257/E29.147
(Continued)

*Primary Examiner* — David C Spalla
(74) *Attorney, Agent, or Firm* — Winston Hsu (57) ABSTRACT

A semiconductor device includes a substrate having a logic region and a high-voltage (HV) region, a first gate structure on the HV region, a first epitaxial layer and a second epitaxial layer adjacent to one side of the first gate structure, a first contact plug between the first epitaxial layer and the second epitaxial layer, a third epitaxial layer and a fourth epitaxial layer adjacent to another side of the first gate structure, and a second contact plug between the third epitaxial layer and the fourth epitaxial layer. Preferably, a bottom surface of the first epitaxial layer is lower than a bottom surface of the first contact plug and a bottom surface of the third epitaxial layer is lower than a bottom surface of the second contact plug.

8 Claims, 4 Drawing Sheets

Related U.S. Application Data continuation of application No. 17/100,963, filed on Nov. 23, 2020, now Pat. No. 11,289,572.

(58) Field of Classification Search
CPC ............. H01L 29/7851; H01L 29/7853; H01L 29/7855; H01L 2029/7858
See application file for complete search history.

(56) References Cited

U.S. PATENT DOCUMENTS

| | | | |
|---|---|---|---|
| 2007/0069293 A1 | 3/2007 | Kavalieros et al. | |
| 2012/0329240 A1* | 12/2012 | Fujii | H01L 21/823481 |
| | | | 438/424 |
| 2015/0060942 A1* | 3/2015 | Kume | H01L 29/7813 |
| | | | 257/190 |
| 2017/0365522 A1* | 12/2017 | Jeong | H01L 21/823431 |
| 2018/0096934 A1* | 4/2018 | Siew | H01L 29/41791 |
| 2019/0097006 A1* | 3/2019 | Li | H01L 29/66795 |
| 2021/0193816 A1* | 6/2021 | Chu | H01L 29/45 |

\* cited by examiner

SEMICONDUCTOR DEVICE

CROSS REFERENCE TO RELATED APPLICATIONS

This application is a continuation application of U.S. application Ser. No. 17/670,528, filed on Feb. 14, 2022, which is a continuation application of U.S. application Ser. No. 17/100,963, filed on Nov. 23, 2020. The contents of these applications are incorporated herein by reference.

BACKGROUND OF THE INVENTION

1. Field of the Invention

The invention relates to a semiconductor device, and more particularly to a semiconductor device integrating fin field effect transistor (FinFET) and high-voltage device.

2. Description of the Prior Art

With increasing miniaturization of semiconductor devices, it is crucial to maintain the efficiency of miniaturized semiconductor devices in the industry. However, as the size of the field effect transistors (FETs) is continuously shrunk, the development of the planar FETs faces more limitations in the fabricating process thereof. On the other hand, non-planar FETs, such as the fin field effect transistor (Fin FET) have three-dimensional structure, not only capable of increasing the contact to the gate but also improving the controlling of the channel region, such that the non-planar FETs have replaced the planar FETs and become the mainstream of the development.

The current method of forming the Fin FETs is forming a fin structure on a substrate primary, and then forming a gate on the fin structure. The fin structure generally includes the stripe-shaped fin formed by etching the substrate. However, under the requirements of continuous miniaturization, the width of each fin, as well as the pitch between fins have to be shrunk accordingly. Thus, the fabricating process of the Fin FETs also faces more challenges and limitations. For example, the fabricating process is limited by current mask and lithography techniques, such that it has problems to precisely define the position of the fin structure, or to precisely control the etching time, thereby leading to the fin collapse or over-etching issues, and seriously affecting the efficiency of the fin structure.

SUMMARY OF THE INVENTION

According to an embodiment of the present invention, a semiconductor device includes a substrate having a logic region and a high-voltage (HV) region, a first gate structure on the HV region, a first epitaxial layer and a second epitaxial layer adjacent to one side of the first gate structure, a first contact plug between the first epitaxial layer and the second epitaxial layer, a third epitaxial layer and a fourth epitaxial layer adjacent to another side of the first gate structure, and a second contact plug between the third epitaxial layer and the fourth epitaxial layer. Preferably, a bottom surface of the first epitaxial layer is lower than a bottom surface of the first contact plug and a bottom surface of the third epitaxial layer is lower than a bottom surface of the second contact plug.

According to another aspect of the present invention, a semiconductor device includes a substrate having a logic region and a high-voltage (HV) region, a first gate structure extending along a first direction on the HV region, and a first epitaxial layer extending along a second direction adjacent to one side of the first gate structure. Preferably, the first epitaxial layer includes a first ring shape according to a top view.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
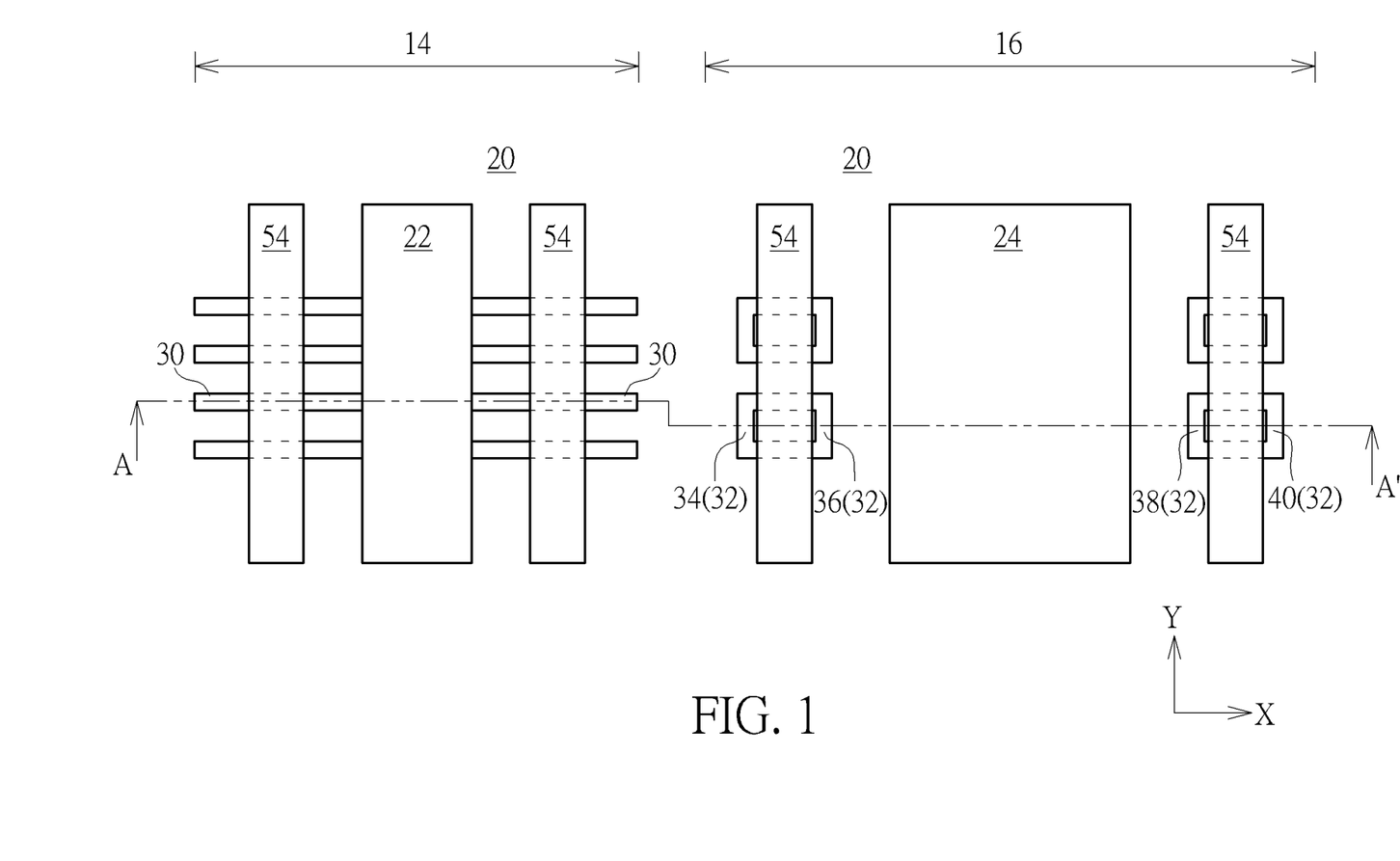
FIG. 1 illustrates a top view for fabricating a semiconductor device according to an embodiment of the present invention.
Figure 2:
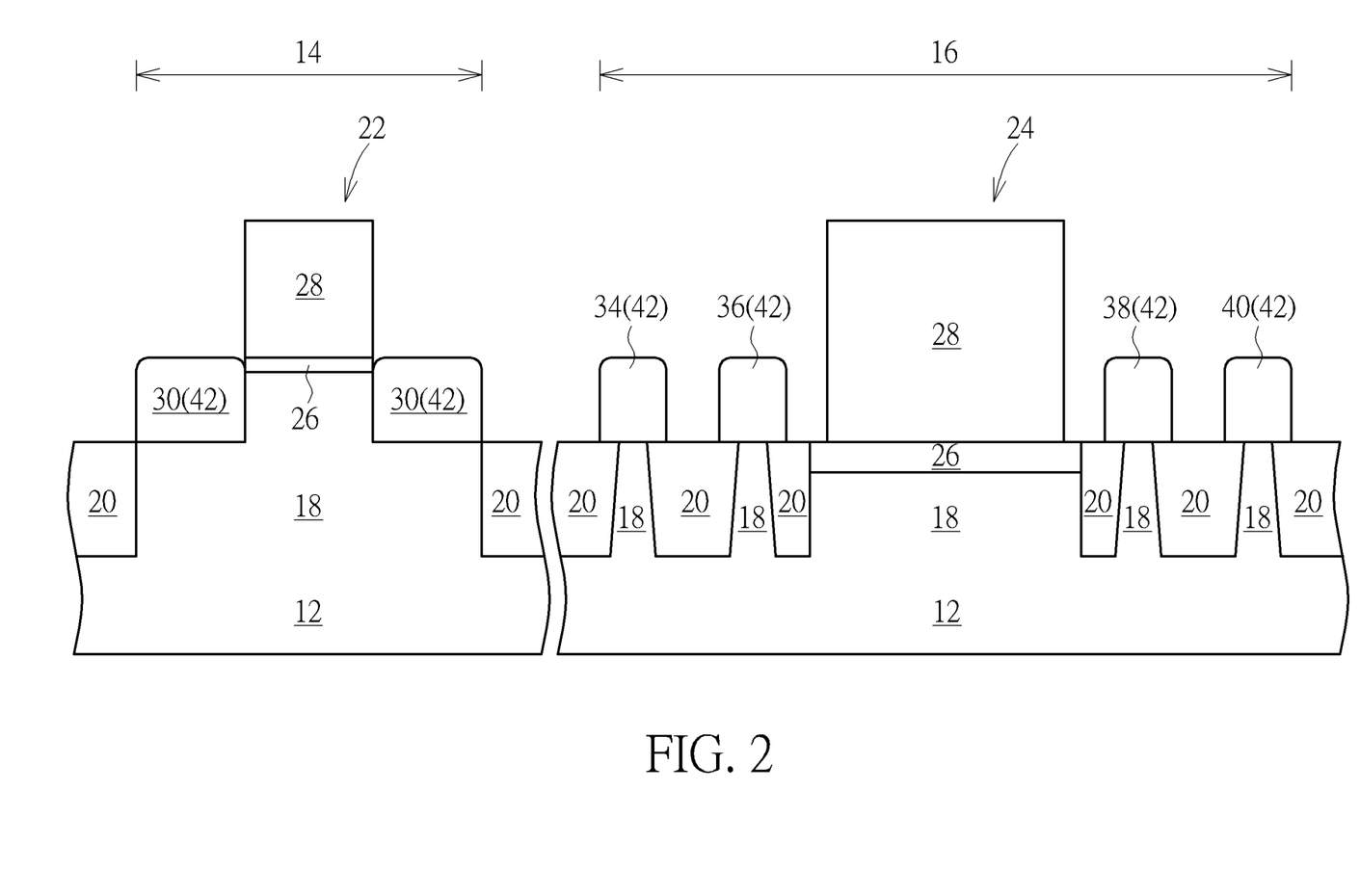
FIGS. 2-3 illustrate cross-section views for fabricating the semiconductor device along the sectional line AA'.
Figure 3:
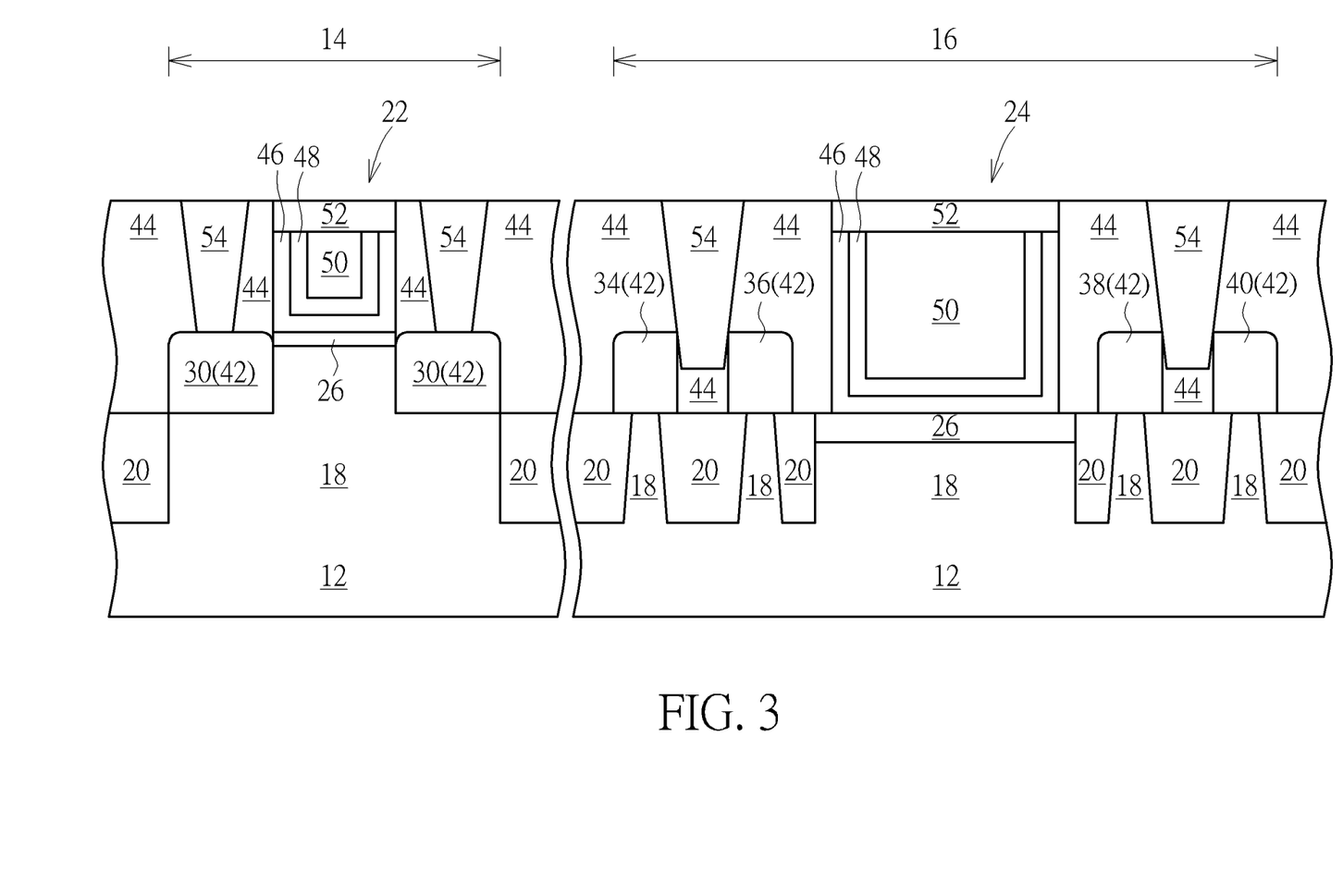

Referring to FIGS. 1-3, FIGS. 1-3 illustrate a method for fabricating a semiconductor device according to an embodiment of the present invention, in which FIG. 1 illustrates a top view for fabricating the semiconductor device according to an embodiment of the present invention and FIGS. 2-3 illustrate cross-section views for fabricating the semiconductor device along the sectional line AA'. As shown in FIGS. 1-3, a substrate 12, such as a silicon substrate or silicon-on-insulator (SOI) substrate is provided and two or more transistor regions, such as a logic region 14 and a high-voltage (HV) region 16 are defined on the substrate 12. In this embodiment, the two regions 14, 16 are transistor regions sharing same conductive type, such as all being PMOS regions or NMOS regions and the two regions 14, 16 are defined to fabricate gate structures having different threshold voltages in the later process. In this embodiment, at least a fin-shaped structure 18 is formed on each of the transistor regions 14, 16 and the bottom of the fin-shaped structures 18 are surrounded by a shallow trench isolation (STI) (not shown) composed of silicon oxide. It should be noted that even though this embodiment pertains to a FinFET process, it would also be desirable to apply the process of this embodiment to a non-planar MOS transistor, which is also within the scope of the present invention.

The fin-shaped structures 18 of this embodiment are preferably obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 18 of this embodiment could also be obtained by first forming a patterned mask (not shown) on the substrate, 12, and through an etching process, the pattern of the patterned mask is transferred to the substrate 12 to form the fin-shaped structures 18. Moreover, the formation of the fin-shaped structures 18 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 18. These approaches for forming fin-shaped structures 18 are all within the scope of the present invention.

It should be noted that during the formation of the fin-shaped structure 18, it would be desirable to first conduct an etching process to remove part of the fin-shaped structures 18 on the HV region 16 so that the top surface of the fin-shaped structures 18 on the HV region 16 is slightly lower than the top surface of the fin-shaped structures 18 on the logic region 14. Moreover, as the aforementioned SIT process and fin cut process were conducted, only part of the fin-shaped structures 18 on the logic region 14 were removed to form columnar or stripe-shape fin-shaped structures 18 while the fin-shaped structures 18 on the HV region 16 still maintain a ring-shape layout according to a top view perspective. In other words, after the fin cut process is completed, a plurality of stripe-shape fin-shaped structures 18 are disposed on the logic region 14 in a top view perspective and a plurality of ring-shape fin-shaped structures 18 are disposed on the HV region 16 in a top view perspective.

Next, gate structures 22, 24 or dummy gates are formed on the substrate 12 on the logic region 14 and the HV region 16 respectively. In this embodiment, the formation of the gate structures 22, 24 could be accomplished by a gate first process, a high-k first approach from gate last process, or a high-k last approach from gate last process. Since this embodiment pertains to a high-k last approach, a gate dielectric layer 26 or interfacial layer, a gate material layer 28 preferably made of polysilicon, and a selective hard mask (not shown) could be formed sequentially on the substrate 12, and a pattern transfer process is then conducted by using a patterned resist (not shown) as mask to remove part of the hard mask and part of the gate material layer 28 through single or multiple etching processes. After stripping the patterned resist, gate structures 22, 24 each composed of a gate dielectric layer 26 and a patterned gate material layer 28 are formed on the substrate 12. It should be noted that the gate dielectric layers 26 on the logic region 14 and the HV region 16 preferably include different thicknesses for coping different voltage environments, in which the thickness of the gate dielectric layer 26 on the logic region 14 is preferably less than the thickness of the gate dielectric layer 26 on the HV region 26. In this embodiment, the gate dielectric layers 26 on both logic region 14 and HV region 16 are preferably made of silicon oxide, but not limited thereto.

Next, at least a spacer (not shown) is formed on sidewalls of the gate structures 22, 24. In this embodiment, the spacer could be a single spacer or a composite spacer, in which the spacer could further include an offset spacer (not shown) and a main spacer (not shown). The offset spacer and the main spacer are preferably made of different materials while the offset spacer and main spacer could all be selected from the group consisting of $SiO_2$, SiN, SiON, and SiCN, but not limited thereto.

Next, a dry etching and/or wet etching process is conducted by using the gate structures 22, 24 and spacers as mask to remove part of the substrate 12 through single or multiple etching processes for forming recesses (not shown) in the substrate 12 adjacent to two sides of the gate structures 22, 24. Next, a selective epitaxial growth (SEG) is conducted by using gas such as dichlorosilane (DCS) to form epitaxial layers in the recesses, such as the epitaxial layers 30 adjacent to two sides of the gate structure 22 and epitaxial layers 32 adjacent to two sides of the gate structure 24. As shown in FIG. 1, since the epitaxial layers 30, 32 are grown upward from the fin-shaped structures 18, the shape of the epitaxial layers 30, 32 are preferably the same as the shape of the original fin-shaped structures 18 under a top view perspective. For instance, the epitaxial layers 30 on the logic region 14 preferably include a plurality of stripe-shape patterns adjacent to two sides of the gate structure 22 while the epitaxial layers 32 on the HV region 16 include ring-shape patterns adjacent to two sides of the gate structure 24. Since the epitaxial layers 32 on the HV region 16 include ring-shape patterns according to a top view perspective, the epitaxial layers 32 shown in the cross-section view of FIG. 2 preferably includes two independent epitaxial layers 34, 36 (such as the portion of the epitaxial layers 32 extending along the Y-direction in FIG. 2) adjacent to left side of the gate structure 24 and two additional epitaxial layers 38, 40 adjacent to right side of the gate structure 24.

As shown in FIG. 2, the top surface of the epitaxial layers 30, 32 on the logic region 14 and HV region 16 is slightly higher than the top surface of the fin-shaped structures 22, 24 and the top surface of the epitaxial layers 30 on the logic region 14 could be even with or slightly higher than the top surface of the epitaxial layers 32, in which the epitaxial layers 30, 32 also share substantially same cross-section shape with the recesses. For instance, the cross-section of the epitaxial layers 30, 32 could also include a circle, a hexagon, or an octagon depending on the demand of the product. In this embodiment, the epitaxial layers 30, 32 could also be formed to include different materials depending on the type of transistor being fabricated. For instance, if the MOS transistor being fabricated were to be a PMOS transistor, the epitaxial layers 30, 32 could be made of material including but not limited to for example SiGe, SiGeB, or SiGeSn. If the MOS transistor being fabricated were to be a NMOS transistor, the epitaxial layers 30, 32 could be made of material including but not limited to for example SiC, SiCP, or SiP. Moreover, the SEG process could also be adjusted to form a single-layered epitaxial structure or multi-layered epitaxial structure, in which heteroatom such as germanium atom or carbon atom of the structure could be formed to have gradient while the surface of the epitaxial layers 30, 32 is preferred to have less or no germanium atom at all to facilitate the formation of silicide afterwards.

Next, an ion implantation process is conducted to form source/drain regions 42 in part of all of the epitaxial layers 30, 32. According to another embodiment of the present invention, the source/drain regions 42 could also be formed insituly during the SEG process. For instance, the source/drain regions 42 could be formed by implanting p-type dopants during formation of a SiGe epitaxial layer, a SiGeB epitaxial layer, or a SiGeSn epitaxial layer for PMOS transistor, or could be formed by implanting n-type dopants during formation of a SiC epitaxial layer, SiCP epitaxial layer, or SiP epitaxial layer for NMOS transistor. By doing so, it would be desirable to eliminate the need for conducting an extra ion implantation process for forming the source/ drain regions. Moreover, the dopants within the source/drain regions 42 could also be formed with a gradient, which is also within the scope of the present invention.

Next, as shown in FIG. 3, a selective contact etch stop layer (CESL) (not shown) could be formed on the substrate 12 surface and the gate structures 22, 24, and an interlayer dielectric (ILD) layer 44 is formed on the CESL afterwards. Next, a planarizing process such as a chemical mechanical polishing (CMP) process is conducted to remove part of the ILD layer 44 and part of the CESL to expose the gate material layer 28 composed of polysilicon so that the top surfaces of the gate material layer 28 and ILD layer 44 are coplanar.

Next, a replacement metal gate (RMG) process is conducted to transform the gate structures 22, 24 into metal gates. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layers 28 from gate structures 22, 24 for forming recesses (not shown) in the ILD layer 44. Next, a high-k dielectric layer 46, a work function metal layer 48, and a low resistance metal layer 50 are formed in the recesses, and a planarizing process such as CMP is conducted to remove part of low resistance metal layer 50, part of work function metal layer 48, and part of high-k dielectric layer 46 to form metal gates. In this embodiment, each of the gate structures 22, 24 or metal gates fabricated through high-k last process of a gate last process preferably includes an interfacial layer or gate dielectric layer 26, a U-shaped high-k dielectric layer 46, a U-shaped work function metal layer 48, and a low resistance metal layer 50.

In this embodiment, the high-k dielectric layer 46 is preferably selected from dielectric materials having dielectric constant (k value) larger than 4. For instance, the high-k dielectric layer 46 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 48 is formed for tuning the work function of the metal gate in accordance with the conductivity of the device. For an NMOS transistor, the work function metal layer 48 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 48 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 48 and the low resistance metal layer 50 may include titanium (Ti), titanium nitride (TiN), tantalum (Ta) or tantalum nitride (TaN). Furthermore, the material of the low-resistance metal layer 50 may include copper (Cu), aluminum (Al), titanium aluminum (TiAl), cobalt tungsten phosphide (CoWP) or any combination thereof. Since the transformation of dummy gates into metal gates through RMG process is well known to those skilled in the art, the details of which are not explained herein for the sake of brevity. Next, part of the high-k dielectric layer 46, part of the work function metal layer 48, and part of the low resistance metal layer 50 are removed to form recesses (not shown), and a hard mask 52 is formed into each of the recesses so that the top surfaces of the hard masks 52 and the ILD layer 44 are coplanar. Preferably the hard masks 52 could include $SiO_2$, SiN, SiON, SiCN, or combination thereof.

Next, a photo-etching process is conducted by using a patterned mask (not shown) as mask to remove part of the ILD layer 44 and part of the CESL adjacent to the gate structures 22, 24 for forming contact holes (not shown) exposing the source/drain regions 42 underneath. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as CMP is conducted to remove part of aforementioned barrier layer and low resistance metal layer for forming contact plugs 54 electrically connecting the source/drain regions 42. This completes the fabrication of a semiconductor device according to an embodiment of the present invention.

Referring again to FIG. 1, FIG. 1 further illustrates a top view of a semiconductor device according to an embodiment of the present invention. As shown in FIG. 1, the semiconductor device preferably includes a gate structure 22 extending along a first direction such as Y-direction on the logic region 14 on the substrate 12, a gate structure 24 also extending along the Y-direction on the HV region 16 on the substrate 12, epitaxial layers 30 extending along a second direction such as X-direction adjacent to two sides of the gate structure 22, a plurality of epitaxial layers 32 disposed adjacent to two sides of the gate structure 24, contact plugs 54 extending along the first direction adjacent to two sides of the gate structure 22 on the logic region 14 while overlapping the epitaxial layers 30, and contact plugs 54 extending along the first direction adjacent to two sides of the gate structure 24 on the HV region 16 while overlapping the epitaxial layers 32.

In this embodiment, the epitaxial layers 30 adjacent to two sides of the gate structure 22 on the logic region 14 and the epitaxial layers 32 adjacent to two sides of the gate structure 24 preferably include different shapes under a top view perspective. Preferably, each of the epitaxial layers 30 adjacent to two sides of the gate structure 22 on the logic region 14 includes a rectangular shape while each of the epitaxial layers 32 adjacent to two sides of the gate structure 24 on the HV region 16 includes a ring-shape. Viewing from a more detailed perspective, each of the ring-shaped epitaxial layers 32 on the HV region 16 includes two portions extending along horizontal direction and two portions extending along vertical direction. For instance, each of the ring-shaped epitaxial layers 32 adjacent to left side of the gate structure 24 includes two epitaxial layers (not labeled) extending along the horizontal direction and two epitaxial layers 34, 36 extending along the vertical direction.

Referring to FIG. 3, FIG. 3 illustrates a cross-section view of a semiconductor device according to an embodiment of the present invention. As shown in FIG. 3, the semiconductor device includes a gate structure 22 disposed on the logic region 14, a gate structure 24 disposed on the HV region 16, epitaxial layers 30 disposed adjacent to two sides of the gate structure 22, epitaxial layers 34, 36 adjacent to one side of the gate structure 24, epitaxial layers 38, 40 adjacent to another side of the gate structure 24, fin-shaped structures 18 disposed between the epitaxial layers 34, 36, 38, 40 and the substrate 12, and STI 20 surrounding the fin-shaped structure 18.

In this embodiment, the top surface of the gate structure 22 on the logic region 14 is preferably even with the top surface of the gate structure 24 on the HV region 16, the bottom surface of the gate structure 24 on the HV region 16 is lower than the bottom surface of the gate structure 22 on the logic region 14, the contact plug 54 on left side of the gate structure 24 is between the epitaxial layers 34, 36, the contact plug 54 on right side of the gate structure 24 is between the epitaxial layers 38, 40, the bottom surface of each of the epitaxial layers 34, 36, 38, 40 is lower than the bottom surface of the contact plugs 54 and even with the top surface of the STI 20, the ILD layer 44 is surrounding the gate structures 22, 24 and epitaxial layers 34, 36, 38, 40 and directly contacting the epitaxial layers 34, 36, 38, 40, the contact plugs 54, and the STI 20 at the same time. It should also be noted that the distance between the sidewall of the gate structure 24 and the sidewall of the adjacent epitaxial layer 36 on the HV region 16 is approximately twice the thickness of the gate dielectric layer 26 on the HV region 16. For instance, the distance between the sidewall of the gate structure 24 and the sidewall of the epitaxial layer 36 is about 2000 Angstroms while the thickness of the gate dielectric layer 26 is about 1000 Angstroms.

Figure 4:
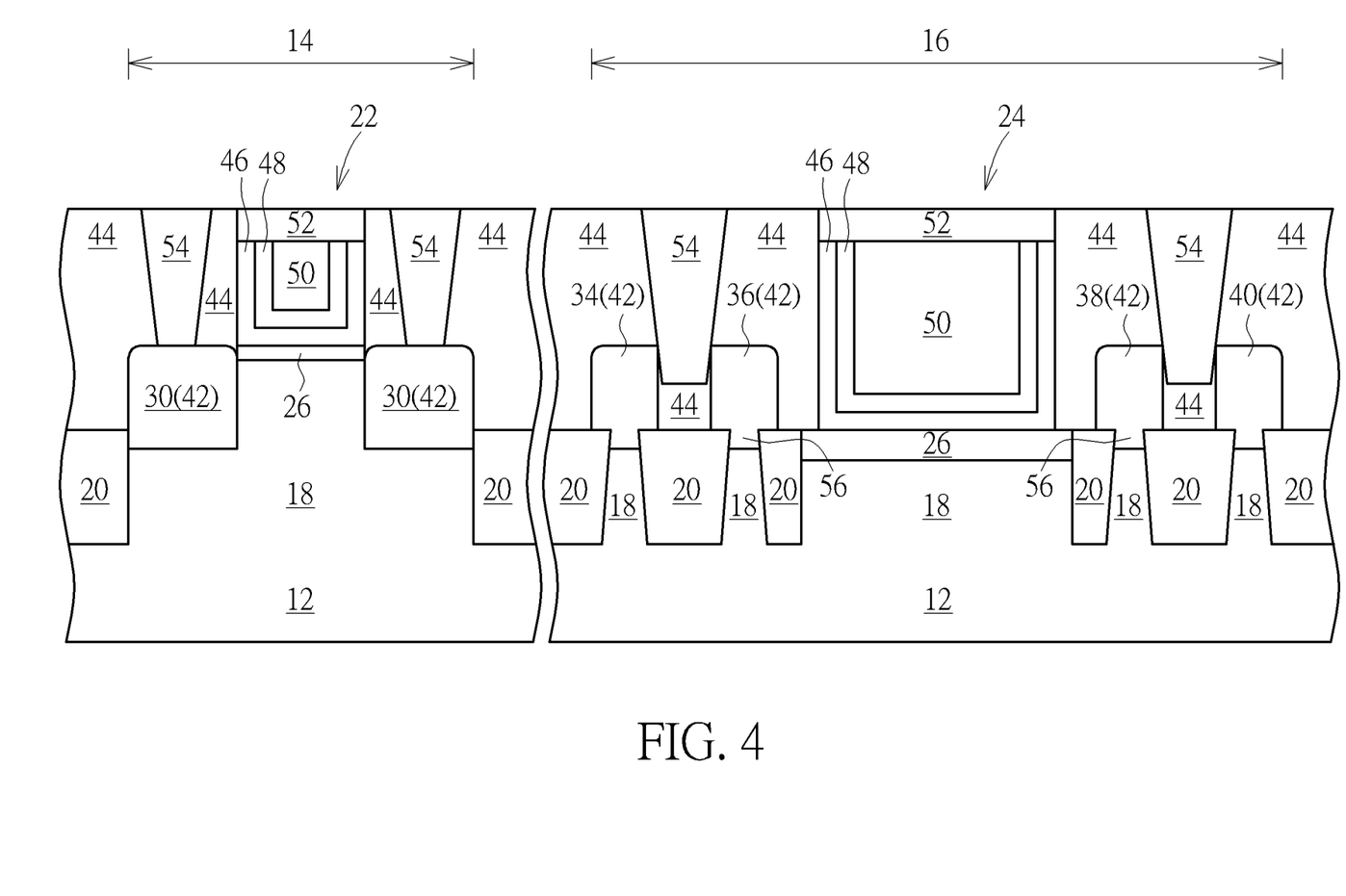
FIG. 4 illustrates a cross-section view of a semiconductor device according to an embodiment of the present invention.

Referring to FIG. 4, FIG. 4 illustrates a cross-section view of a semiconductor device according to an embodiment of the present invention. As shown in FIG. 4, the semiconductor device includes a gate structure 22 disposed on the logic region 14, a gate structure 24 disposed on the HV region 16, epitaxial layers 30 disposed adjacent to two sides of the gate structure 22, epitaxial layers 34, 36 adjacent to one side of the gate structure 24, epitaxial layers 38, 40 adjacent to another side of the gate structure 24, fin-shaped structures 18 disposed between the epitaxial layers 34, 36, 38, 40 and the substrate 12, and STI 20 surrounding the fin-shaped structure 18.

In contrast to the bottom surface of the epitaxial layers 34, 36, 38, 40 in FIG. 3 being lower than the bottom surface of the contact plugs 54 and even with the top surface of the STI 20, it would also be desirable to adjust the depth of the recesses during the formation of the epitaxial layers 30, 3 so that the bottom surface of the epitaxial layers 30, 32 is slightly lower than the top surface of the STI 20. In other words, the bottom of each of the epitaxial layers 34, 36, 38, 40 includes a protrusion 56 or protruding portion inserting into the region between the STI 20 and directly contacting the fin-shaped structures 18 underneath, in which the bottom surface of the protrusions 56 is slightly lower than the top surface of the STI 20.

Overall, the present invention discloses a semiconductor device for integrating FinFET device and high-voltage (HV) device, in which the gate structure of the HV device is preferably formed at the same time with the gate structure on the logic region after part of the fin-shaped structure on the HV region is removed during the formation of fin-shaped structures so that the bottom surface of the gate structure on the HV region is slightly lower than the bottom surface of the gate structure on the logic region while the top surfaces of the gate structures on both HV region and logic region are coplanar. Moreover, the present invention only removes part of the fin-shaped structures on the logic region during aforementioned SIT process and fin cut process while maintaining ring-shape fin-shaped structures on the HV region. By doing so, the selective epitaxial growth (SEG) process conducted afterwards would form stripe-shape epitaxial layers on the logic region and ring-shape epitaxial layers on the HV region in the later process. By following this approach the present invention is able to improve issues such as negative bias temperature instability (NBTI) found in gate structures substantially as semiconductor technology rapidly progressed into nano-scaled era.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate having a logic region and a high-voltage (HV) region;
   a first gate structure on the HV region;
   a first epitaxial layer and a second epitaxial layer adjacent to one side of the first gate structure, wherein the first epitaxial layer and the second epitaxial layer are not contacting each other directly under a cross-section perspective;
   a first contact plug between the first epitaxial layer and the second epitaxial layer, wherein a bottom surface of the first epitaxial layer is lower than a bottom surface of the first contact plug; and
   an interlayer dielectric (ILD) layer under the first contact plug and between the first epitaxial layer and the second epitaxial layer.

2. The semiconductor device of claim 1, further comprising:
   a first fin-shaped structure between the first epitaxial layer and the substrate; and
   a second fin-shaped structure between the second epitaxial layer and the substrate.

3. The semiconductor device of claim 2, wherein the first gate structure comprises a gate dielectric layer, wherein the top surfaces of the gate dielectric layer and the first fin-shaped structure are coplanar.

4. The semiconductor device of claim 3, further comprising a shallow trench isolation (STI) surrounding the first fin-shaped structure, the second fin-shaped structure, and the gate dielectric layer.

5. The semiconductor device of claim 4, further comprising the interlayer dielectric (ILD) layer between the first epitaxial layer and the STI.

6. The semiconductor device of claim 1, further comprising:
   a third epitaxial layer and a fourth epitaxial layer adjacent to another side of the first gate structure; and
   a second contact plug between the third epitaxial layer and the fourth epitaxial layer, wherein a bottom surface of the third epitaxial layer is lower than a bottom surface of the second contact plug.

7. The semiconductor device of claim 6, further comprising:
   a third fin-shaped structure between the third epitaxial layer and the substrate; and
   a fourth fin-shaped structure between the fourth epitaxial layer and the substrate.

8. The semiconductor device of claim 1, further comprising:

a second gate structure on the logic region, wherein a bottom surface of the first gate structure is lower than a bottom surface of the second gate structure.

\* \* \* \* \*